US012776371B2

(12) United States Patent
Gotterba et al.

(10) Patent No.: US 12,776,371 B2
(45) Date of Patent: Oct. 27, 2026

(54) FAST, AREA EFFICIENT WORDLINE DECODING SCHEME

(71) Applicant: NVIDIA Corporation, Santa Clara, CA (US)

(72) Inventors: Andreas Gotterba, Santa Clara, CA (US); Farhat Perveen, Santa Clara, CA (US)

(73) Assignee: NVIDIA Corporation, Santa Clara, CA (US)

(*) Notice: Subject to any disclaimer, the term of this patent is extended or adjusted under 35 U.S.C. 154(b) by 108 days.

(21) Appl. No.: 18/790,390

(22) Filed: Jul. 31, 2024

(65) Prior Publication Data

US 2026/0038591 A1 Feb. 5, 2026

(51) Int. Cl.
*G11C 16/08* (2006.01)
*G11C 16/32* (2006.01)

(52) U.S. Cl.
CPC .............. *G11C 16/08* (2013.01); *G11C 16/32* (2013.01)

(58) Field of Classification Search
CPC ................................ G11C 16/08; G11C 16/32
USPC ........................................ 365/189.05, 230.06
See application file for complete search history.

(56) References Cited

U.S. PATENT DOCUMENTS 5,208,783 A * 5/1993 Ninomiya ................ G11C 8/18 365/194
5,642,316 A * 6/1997 Tran ....................... G11C 29/76 365/225.7
6,055,203 A * 4/2000 Agarwal .................. G11C 8/10 365/204
6,704,241 B1 * 3/2004 Ha ........................... G11C 8/10 365/185.11
7,583,559 B2 * 9/2009 Giduturi .................. G11C 8/12 365/230.06
8,625,382 B2 * 1/2014 Hendrickson ............ G11C 8/12 365/230.01
9,946,648 B1 * 4/2018 Zhang ................. G06F 11/3037
2011/0032784 A1 * 2/2011 Pyeon ....................... G11C 7/20 365/230.06
2012/0327735 A1 * 12/2012 Hendrickson ............ G11C 8/10 365/230.06

(Continued)

FOREIGN PATENT DOCUMENTS

CN 113258902 A * 8/2021 ............. H03H 17/04
EP 0543269 A2 * 5/1993 ............... G11C 8/18

*Primary Examiner* — Michael T Tran

(57) ABSTRACT

The disclosure provides an improved pre-decoding scheme that uses pre-decoders with multiple decoders that generate clocked pre-decoded signals, which reduces address set-up time and hold. The ordering of the address bits processed by the multiple decoders is also arranged to advantageously allow sharing logic gates of the multiple decoders, sharing of nodes of the logic gates, or sharing a combination of both. In one example, a memory circuit is disclosed that includes: (1) an array of memory cells arranged in rows and columns, and (2) an address decoder for decoding a binary address to assert wordlines associated with the rows, wherein the address decoder has (2A) a row decoder for asserting one of the wordlines based on clocked-pre-decode signals, and (2B) a pre-decoder having multiple decoders that generate the clocked pre-decode signals from the binary address and provide the clocked pre-decode signals to the row decoder for the asserting.

20 Claims, 7 Drawing Sheets

700

(56) References Cited

U.S. PATENT DOCUMENTS

| | | | | |
|---|---|---|---|---|
| 2014/0198598 | A1* | 7/2014 | Jung | G11C 8/10 365/226 |
| 2015/0067264 | A1* | 3/2015 | Eckert | G06F 12/126 711/133 |
| 2017/0062055 | A1* | 3/2017 | Polizzi | G11C 16/32 |
| 2018/0011768 | A1* | 1/2018 | Bradbury | G06F 9/467 |
| 2018/0232320 | A1* | 8/2018 | Raval | G06F 12/1081 |
| 2019/0294364 | A1* | 9/2019 | Wang | G06F 3/0625 |
| 2020/0192721 | A1* | 6/2020 | Mclean | G06F 9/5061 |
| 2020/0233808 | A1* | 7/2020 | Oma | G06F 12/126 |
| 2022/0103191 | A1* | 3/2022 | Ganapathy | G06F 12/0895 |

* cited by examiner

MEMORY ARRAY
120
WORDLINE
ADDRESS DECODER
110
ROW
DECODER
114
PRE-
DECODER
112
BINARY
ADDRESS
CLOCK
SIGNAL
100

TABLE 1

| ADR | | | | | | | | pre-decode lines | | | | block selector | row selector | wordline |
|---|---|---|---|---|---|---|---|---|---|---|---|---|---|---|
| 7 | 6 | 5 | 4 | 3 | 2 | 1 | 0 | bx1 | bx0 | rx1 | rx0 | blk# | row# | WL# |
| 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 1 | 0 | 1 | 0 | 0 | 1 | 0 | 1 |
| 0 | 0 | 0 | 0 | 0 | 0 | 1 | 0 | 0 | 2 | 0 | 0 | 2 | 0 | 2 |
| 0 | 0 | 0 | 0 | 0 | 0 | 1 | 1 | 0 | 3 | 0 | 0 | 3 | 0 | 3 |
| 0 | 0 | 0 | 0 | 0 | 1 | 0 | 0 | 0 | 0 | 0 | 1 | 0 | 1 | 4 |
| 0 | 0 | 0 | 0 | 0 | 1 | 0 | 1 | 0 | 1 | 0 | 1 | 1 | 1 | 5 |
| 0 | 0 | 0 | 0 | 0 | 1 | 1 | 0 | 0 | 2 | 0 | 1 | 2 | 1 | 6 |
| 0 | 0 | 0 | 0 | 0 | 1 | 1 | 1 | 0 | 3 | 0 | 1 | 3 | 1 | 7 |
| 0 | 0 | 0 | 0 | 1 | 0 | 0 | 0 | 0 | 0 | 0 | 2 | 0 | 2 | 8 |
| 0 | 0 | 0 | 0 | 1 | 0 | 0 | 1 | 0 | 1 | 0 | 2 | 1 | 2 | 9 |
| 0 | 0 | 0 | 0 | 1 | 0 | 1 | 0 | 0 | 2 | 0 | 2 | 2 | 2 | 10 |
| 0 | 0 | 0 | 0 | 1 | 0 | 1 | 1 | 0 | 3 | 0 | 2 | 3 | 2 | 11 |
| 0 | 0 | 0 | 0 | 1 | 1 | 0 | 0 | 0 | 0 | 0 | 3 | 0 | 3 | 12 |
| 0 | 0 | 0 | 0 | 1 | 1 | 0 | 1 | 0 | 1 | 0 | 3 | 1 | 3 | 13 |
| 0 | 0 | 0 | 0 | 1 | 1 | 1 | 0 | 0 | 2 | 0 | 3 | 2 | 3 | 14 |
| 0 | 0 | 0 | 0 | 1 | 1 | 1 | 1 | 0 | 3 | 0 | 3 | 3 | 3 | 15 |
| 0 | 0 | 0 | 1 | 0 | 0 | 0 | 0 | 0 | 0 | 1 | 0 | 0 | 4 | 16 |
| 0 | 0 | 0 | 1 | 0 | 0 | 0 | 1 | 0 | 1 | 1 | 0 | 1 | 4 | 17 |
| 0 | 0 | 0 | 1 | 0 | 0 | 1 | 0 | 0 | 2 | 1 | 0 | 2 | 4 | 18 |
| 0 | 0 | 0 | 1 | 0 | 0 | 1 | 1 | 0 | 3 | 1 | 0 | 3 | 4 | 19 |
| 0 | 0 | 0 | 1 | 0 | 1 | 0 | 0 | 0 | 0 | 1 | 1 | 0 | 5 | 20 |
| 0 | 0 | 0 | 1 | 0 | 1 | 0 | 1 | 0 | 1 | 1 | 1 | 1 | 5 | 21 |
| 0 | 0 | 0 | 1 | 0 | 1 | 1 | 0 | 0 | 2 | 1 | 1 | 2 | 5 | 22 |
| 0 | 0 | 0 | 1 | 0 | 1 | 1 | 1 | 0 | 3 | 1 | 1 | 3 | 5 | 23 |
| 0 | 0 | 0 | 1 | 1 | 0 | 0 | 0 | 0 | 0 | 1 | 2 | 0 | 6 | 24 |
| 0 | 0 | 0 | 1 | 1 | 0 | 0 | 1 | 0 | 1 | 1 | 2 | 1 | 6 | 25 |
| 0 | 0 | 0 | 1 | 1 | 0 | 1 | 0 | 0 | 2 | 1 | 2 | 2 | 6 | 26 |
| 0 | 0 | 0 | 1 | 1 | 0 | 1 | 1 | 0 | 3 | 1 | 2 | 3 | 6 | 27 |
| 0 | 0 | 0 | 1 | 1 | 1 | 0 | 0 | 0 | 0 | 1 | 3 | 0 | 7 | 28 |
| 0 | 0 | 0 | 1 | 1 | 1 | 0 | 1 | 0 | 1 | 1 | 3 | 1 | 7 | 29 |
| 0 | 0 | 0 | 1 | 1 | 1 | 1 | 0 | 0 | 2 | 1 | 3 | 2 | 7 | 30 |
| 0 | 0 | 0 | 1 | 1 | 1 | 1 | 1 | 0 | 3 | 1 | 3 | 3 | 7 | 31 |
| 0 | 0 | 1 | 0 | 0 | 0 | 0 | 0 | 0 | 0 | 2 | 0 | 0 | 8 | 32 |
| 0 | 0 | 1 | 0 | 0 | 0 | 0 | 1 | 0 | 1 | 2 | 0 | 1 | 8 | 33 |
| 0 | 0 | 1 | 0 | 0 | 0 | 1 | 0 | 0 | 2 | 2 | 0 | 2 | 8 | 34 |
| 0 | 0 | 1 | 0 | 0 | 0 | 1 | 1 | 0 | 3 | 2 | 0 | 3 | 8 | 35 |
| 0 | 0 | 1 | 0 | 0 | 1 | 0 | 0 | 0 | 0 | 2 | 1 | 0 | 9 | 36 |
| 0 | 0 | 1 | 0 | 0 | 1 | 0 | 1 | 0 | 1 | 2 | 1 | 1 | 9 | 37 |
| 0 | 0 | 1 | 0 | 0 | 1 | 1 | 0 | 0 | 2 | 2 | 1 | 2 | 9 | 38 |
| 0 | 0 | 1 | 0 | 0 | 1 | 1 | 1 | 0 | 3 | 2 | 1 | 3 | 9 | 39 |
| 0 | 0 | 1 | 1 | 1 | 0 | 0 | 0 | 0 | 0 | 3 | 2 | 0 | 14 | 56 |
| 0 | 0 | 1 | 1 | 1 | 0 | 0 | 1 | 0 | 1 | 3 | 2 | 1 | 14 | 57 |
| 0 | 0 | 1 | 1 | 1 | 0 | 1 | 0 | 0 | 2 | 3 | 2 | 2 | 14 | 58 |
| 0 | 0 | 1 | 1 | 1 | 0 | 1 | 1 | 0 | 3 | 3 | 2 | 3 | 14 | 59 |
| 0 | 0 | 1 | 1 | 1 | 1 | 0 | 0 | 0 | 0 | 3 | 3 | 0 | 15 | 60 |
| 0 | 0 | 1 | 1 | 1 | 1 | 0 | 1 | 0 | 1 | 3 | 3 | 1 | 15 | 61 |
| 0 | 0 | 1 | 1 | 1 | 1 | 1 | 0 | 0 | 2 | 3 | 3 | 2 | 15 | 62 |
| 0 | 0 | 1 | 1 | 1 | 1 | 1 | 1 | 0 | 3 | 3 | 3 | 3 | 15 | 63 |
| 0 | 1 | 0 | 0 | 0 | 0 | 0 | 0 | 1 | 0 | 0 | 0 | 4 | 0 | 64 |
| 0 | 1 | 0 | 0 | 0 | 0 | 0 | 1 | 1 | 1 | 0 | 0 | 5 | 0 | 65 |
| 0 | 1 | 0 | 0 | 0 | 0 | 1 | 0 | 1 | 2 | 0 | 0 | 6 | 0 | 66 |
| 0 | 1 | 0 | 0 | 0 | 0 | 1 | 1 | 1 | 3 | 0 | 0 | 7 | 0 | 67 |
| 0 | 1 | 0 | 0 | 0 | 1 | 0 | 0 | 1 | 0 | 0 | 1 | 4 | 1 | 68 |
| 0 | 1 | 0 | 0 | 0 | 1 | 0 | 1 | 1 | 1 | 0 | 1 | 5 | 1 | 69 |
| 0 | 1 | 0 | 0 | 0 | 1 | 1 | 0 | 1 | 2 | 0 | 1 | 6 | 1 | 70 |
| 0 | 1 | 0 | 0 | 0 | 1 | 1 | 1 | 1 | 3 | 0 | 1 | 7 | 1 | 71 |
| 0 | 1 | 0 | 1 | 1 | 0 | 0 | 0 | 1 | 0 | 1 | 2 | 4 | 6 | 88 |
| 0 | 1 | 0 | 1 | 1 | 0 | 0 | 1 | 1 | 1 | 1 | 2 | 5 | 6 | 89 |
| 0 | 1 | 0 | 1 | 1 | 0 | 1 | 0 | 1 | 2 | 1 | 2 | 6 | 6 | 90 |
| 0 | 1 | 0 | 1 | 1 | 0 | 1 | 1 | 1 | 3 | 1 | 2 | 7 | 6 | 91 |
| 0 | 1 | 0 | 1 | 1 | 1 | 0 | 0 | 1 | 0 | 1 | 3 | 4 | 7 | 92 |
| 0 | 1 | 0 | 1 | 1 | 1 | 0 | 1 | 1 | 1 | 1 | 3 | 5 | 7 | 93 |
| 0 | 1 | 0 | 1 | 1 | 1 | 1 | 0 | 1 | 2 | 1 | 3 | 6 | 7 | 94 |
| 0 | 1 | 0 | 1 | 1 | 1 | 1 | 1 | 1 | 3 | 1 | 3 | 7 | 7 | 95 |
| 0 | 1 | 1 | 1 | 1 | 0 | 1 | 0 | 1 | 2 | 3 | 2 | 6 | 14 | 122 |
| 0 | 1 | 1 | 1 | 1 | 0 | 1 | 1 | 1 | 3 | 3 | 2 | 7 | 14 | 123 |
| 0 | 1 | 1 | 1 | 1 | 1 | 0 | 0 | 1 | 0 | 3 | 3 | 4 | 15 | 124 |
| 0 | 1 | 1 | 1 | 1 | 1 | 0 | 1 | 1 | 1 | 3 | 3 | 5 | 15 | 125 |
| 0 | 1 | 1 | 1 | 1 | 1 | 1 | 0 | 1 | 2 | 3 | 3 | 6 | 15 | 126 |
| 1 | 0 | 0 | 1 | 1 | 0 | 0 | 0 | 2 | 0 | 1 | 2 | 8 | 6 | 152 |
| 1 | 0 | 0 | 1 | 1 | 0 | 0 | 1 | 2 | 1 | 1 | 2 | 9 | 6 | 153 |
| 1 | 0 | 0 | 1 | 1 | 0 | 1 | 0 | 2 | 2 | 1 | 2 | 10 | 6 | 154 |
| 1 | 0 | 0 | 1 | 1 | 0 | 1 | 1 | 2 | 3 | 1 | 2 | 11 | 6 | 155 |
| 1 | 0 | 0 | 1 | 1 | 1 | 0 | 0 | 2 | 0 | 1 | 3 | 8 | 7 | 156 |
| 1 | 0 | 0 | 1 | 1 | 1 | 0 | 1 | 2 | 1 | 1 | 3 | 9 | 7 | 157 |
| 1 | 0 | 0 | 1 | 1 | 1 | 1 | 0 | 2 | 2 | 1 | 3 | 10 | 7 | 158 |
| 1 | 0 | 0 | 1 | 1 | 1 | 1 | 1 | 2 | 3 | 1 | 3 | 11 | 7 | 159 |
| 1 | 0 | 1 | 1 | 1 | 0 | 0 | 0 | 2 | 0 | 3 | 2 | 8 | 14 | 184 |
| 1 | 0 | 1 | 1 | 1 | 0 | 0 | 1 | 2 | 1 | 3 | 2 | 9 | 14 | 185 |
| 1 | 0 | 1 | 1 | 1 | 0 | 1 | 0 | 2 | 2 | 3 | 2 | 10 | 14 | 186 |
| 1 | 0 | 1 | 1 | 1 | 0 | 1 | 1 | 2 | 3 | 3 | 2 | 11 | 14 | 187 |
| 1 | 0 | 1 | 1 | 1 | 1 | 0 | 0 | 2 | 0 | 3 | 3 | 8 | 15 | 188 |
| 1 | 0 | 1 | 1 | 1 | 1 | 0 | 1 | 2 | 1 | 3 | 3 | 9 | 15 | 189 |
| 1 | 0 | 1 | 1 | 1 | 1 | 1 | 0 | 2 | 2 | 3 | 3 | 10 | 15 | 190 |
| 1 | 0 | 1 | 1 | 1 | 1 | 1 | 1 | 2 | 3 | 3 | 3 | 11 | 15 | 191 |
| 1 | 1 | 0 | 1 | 1 | 0 | 0 | 0 | 3 | 0 | 1 | 2 | 12 | 6 | 216 |
| 1 | 1 | 0 | 1 | 1 | 0 | 0 | 1 | 3 | 1 | 1 | 2 | 13 | 6 | 217 |
| 1 | 1 | 0 | 1 | 1 | 0 | 1 | 0 | 3 | 2 | 1 | 2 | 14 | 6 | 218 |
| 1 | 1 | 0 | 1 | 1 | 0 | 1 | 1 | 3 | 3 | 1 | 2 | 15 | 6 | 219 |
| 1 | 1 | 0 | 1 | 1 | 1 | 0 | 0 | 3 | 0 | 1 | 3 | 12 | 7 | 220 |
| 1 | 1 | 0 | 1 | 1 | 1 | 0 | 1 | 3 | 1 | 1 | 3 | 13 | 7 | 221 |
| 1 | 1 | 0 | 1 | 1 | 1 | 1 | 0 | 3 | 2 | 1 | 3 | 14 | 7 | 222 |
| 1 | 1 | 0 | 1 | 1 | 1 | 1 | 1 | 3 | 3 | 1 | 3 | 15 | 7 | 223 |
| 1 | 1 | 1 | 1 | 1 | 0 | 0 | 0 | 3 | 0 | 3 | 2 | 12 | 14 | 248 |
| 1 | 1 | 1 | 1 | 1 | 0 | 0 | 1 | 3 | 1 | 3 | 2 | 13 | 14 | 249 |
| 1 | 1 | 1 | 1 | 1 | 0 | 1 | 0 | 3 | 2 | 3 | 2 | 14 | 14 | 250 |
| 1 | 1 | 1 | 1 | 1 | 0 | 1 | 1 | 3 | 3 | 3 | 2 | 15 | 14 | 251 |
| 1 | 1 | 1 | 1 | 1 | 1 | 0 | 0 | 3 | 0 | 3 | 3 | 12 | 15 | 252 |
| 1 | 1 | 1 | 1 | 1 | 1 | 0 | 1 | 3 | 1 | 3 | 3 | 13 | 15 | 253 |
| 1 | 1 | 1 | 1 | 1 | 1 | 1 | 0 | 3 | 2 | 3 | 3 | 14 | 15 | 254 |
| 1 | 1 | 1 | 1 | 1 | 1 | 1 | 1 | 3 | 3 | 3 | 3 | 15 | 15 | 255 |

FIG. 6

FAST, AREA EFFICIENT WORDLINE DECODING SCHEME

TECHNICAL FIELD

This application is directed, in general, to memory circuits, and more specifically, to speeding-up pre-decoding for wordline access and also reducing the physical size of the pre-decoding circuitry.

BACKGROUND

Computing devices are used in many aspects that range from communications to supercomputing. Typically computing devices include one or more processors that perform operations on data stored in memory. Computing devices use a memory address to access the particular data from memory that is needed for particular operations. The memory address is a binary address of a fixed-length sequence of digits that identifies a specific memory location where the data is stored. The fixed-length can vary depending on the number of memory locations of the memory. For example, an 8-bit address bus is needed to address 256 rows of a bitcell memory array.

Regardless the length, memory addresses are decoded to assert the correct memory locations for the desired data. A single stage decoder, however, is typically not practical. As such, an address decoder is often divided into two parts. Continuing the above example, an 8×256 decoder is typically divided into two parts referred to as a pre-decoder and a row-decoder. Several characteristics, such as type of pre-decoder sets and physical location of the pre-decoder sets, can affect the wordline speed and, thus, the memory access time.

SUMMARY

In one aspect, the disclosure provides a memory circuit. In one example, the memory circuit includes: (1) an array of memory cells arranged in rows and columns, and (2) an address decoder for decoding a binary address to assert wordlines associated with the rows, wherein the address decoder has (2A) a row decoder for asserting one of the wordlines based on clocked-pre-decode signals, and (2B) a pre-decoder having multiple decoders that generate the clocked pre-decode signals from the binary address and provide the clocked pre-decode signals to the row decoder for the asserting.

In another aspect, the disclosure provides an integrated circuit (IC). In one example, the IC includes: (1) one or more processors to perform operations for processing data and (2) a memory circuit to store at least some of the data, wherein the memory circuit has (2A) an array of memory cells arranged in columns and rows and (2B) an address decoder for decoding a binary address to assert wordlines associated with the rows. In this example the address decoder includes a row decoder for asserting one of the wordlines based on clocked-pre-decode signals, and a pre-decoder having multiple decoders that generate the clocked pre-decode signals from the binary address and provide the clocked pre-decode signals to the row decoder for the asserting.

In yet another aspect, the disclosure includes a library of circuit designs. In one example, the library has a design for a memory circuit that includes: (1) an array of memory cells arranged in rows and columns, and (2) an address decoder for decoding a binary address to assert wordlines associated with the rows, wherein the address decoder has a row decoder for asserting one of the wordlines based on clocked-pre-decode signals, and a pre-decoder having multiple decoders that generate the clocked pre-decode signals from the binary address and provide the clocked pre-decode signals to the row decoder for the asserting.

BRIEF DESCRIPTION

Reference is now made to the following descriptions taken in conjunction with the accompanying drawings, in which:

FIG. 6 illustrates an example of a logic table showing asserted wordlines based on different binary address inputs applied to pre-decoders, which feeds a row decoder according to the principles of the disclosure.

DETAILED DESCRIPTION

The disclosure provides an improved pre-decoding scheme that reduces the set-up and clock to wordline, which improves memory speed, including both access time and frequency, through multiple optimizations. The improved decoding schemes include pre-decoders having multiple decoders that generate clocked pre-decoded signals, which reduces address set-up time and hold. The ordering of the address bits processed by the multiple decoders is also arranged to advantageously allow sharing logic gates of the multiple decoders, sharing of nodes of the logic gates, or sharing a combination of both. The sharing enabled by the ordering allows keeping logical and address mapping simple without the need of wordline scrambling while optimizing load. Sharing pre-decoding logic allows driving a fewer number of transistors compared to standard decoding designs, which reduces the load and the time required for selecting a wordline.

For example, a pre-decoder is disclosed having four 2×4 decoders that generate four groups of clocked pre-decoded signals. The ordering of the address bits processed by the four decoders is established such that address bits 0 and 5 (adr0 and adr5) are used as block selectors to enable the sharing of logic gates and/or an internal node of the logic gates. Strategically dividing the bits of the binary address allows placing logic gates with common inputs next to each other such that internal nodes of the neighbor logic gates can be shared. Examples of the logic gates are NAND and NOR gates and examples of internal nodes are $n_{int}$ for NAND gates and $p_{int}$ for NOR gates.

Figure 7:
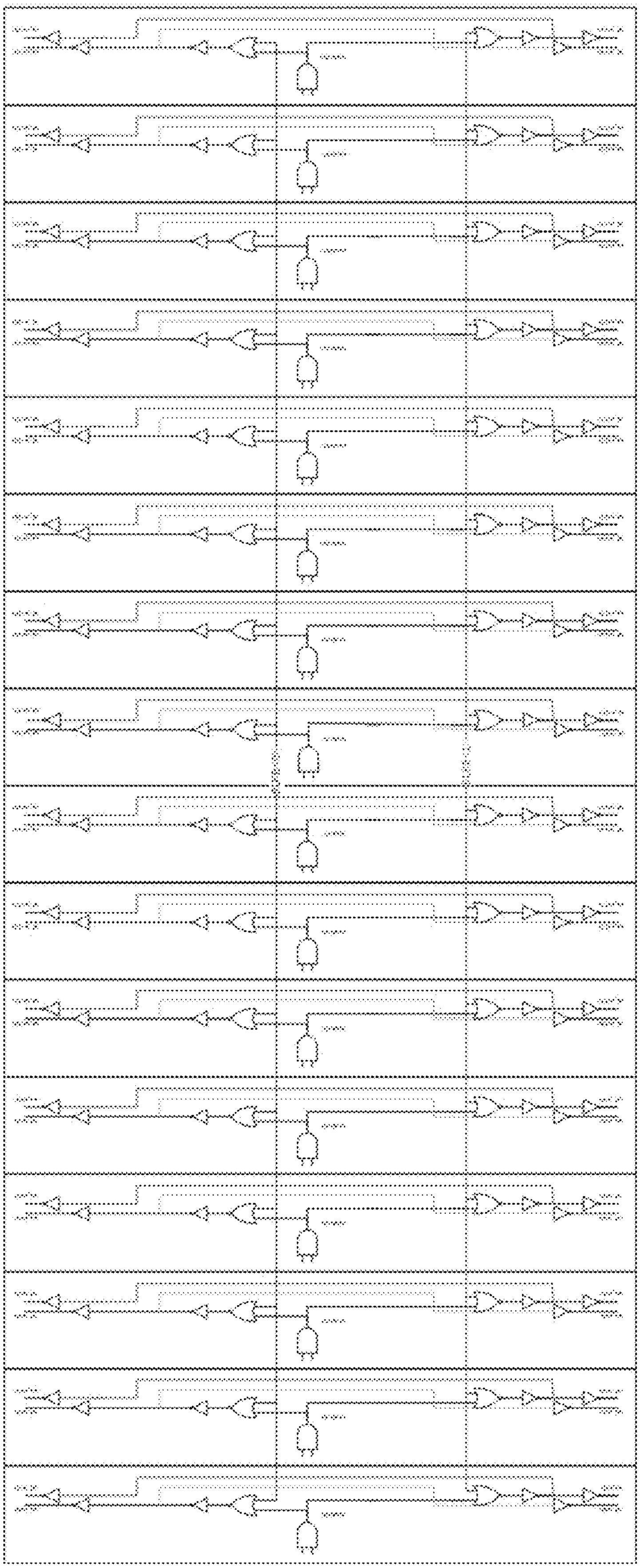
FIG. 7 illustrates a layout of an example of an address decoder constructed according to the principles of the disclosure.

The disclosed pre-decoding scheme also allows a more efficient physical layout to optimize pre-decode signal resistance and capacitance resulting in faster clock to wordline. For example, the pre-decoding scheme allows placing the blkb NAND 2 gate in the center of the physical layout and also limits empty spaces in the physical layout compared to existing layouts of address decoders. Advantageously, the scheme also provides minimizing load on pre-decoded lines while maintaining the fan-out of row-decoder gates. FIG. 7 illustrates an example of a physical layout of an address decoder according to the disclosed pre-decoding scheme. The address decoder of FIG. 7 can be used to access a memory array such as shown in FIG. 1.

Figure 1:
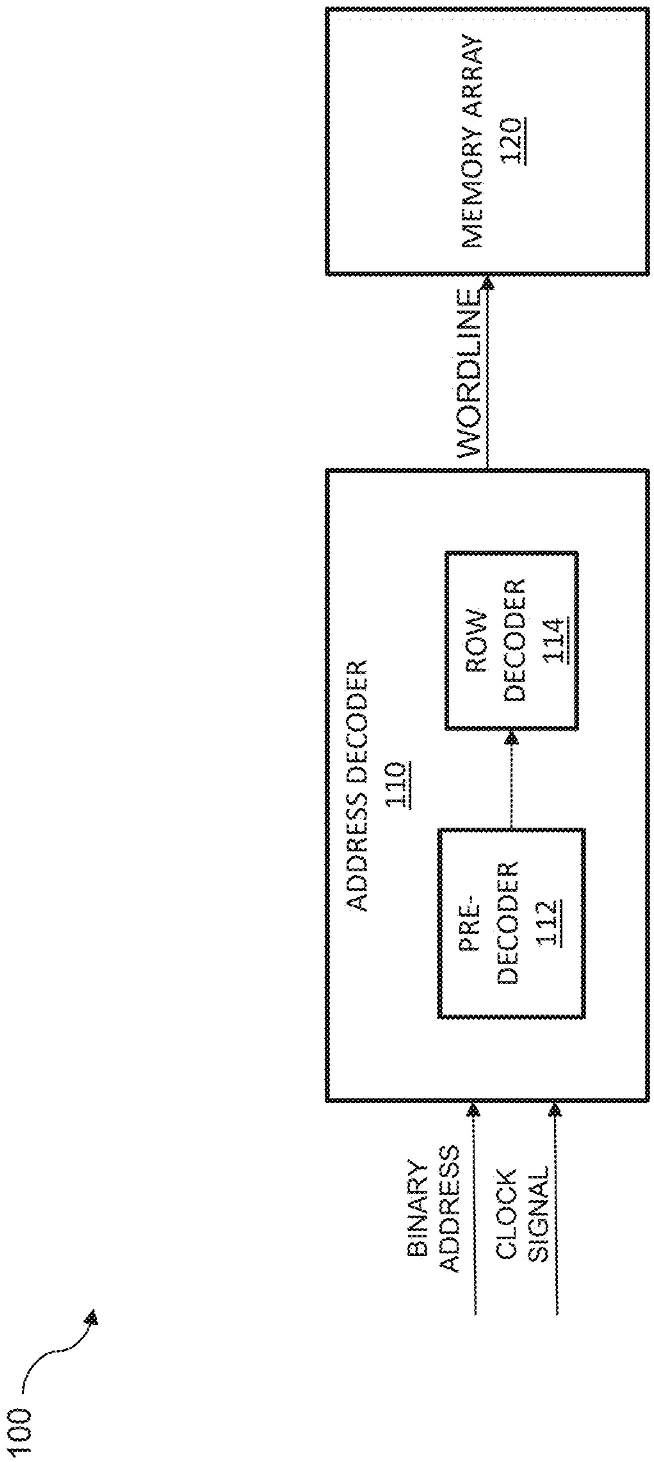
FIG. 1 illustrates a block diagram of an example of a memory circuit constructed according to the principles of the disclosure.

FIG. 1 illustrates a block diagram of an example of a memory circuit 100 constructed according to the principles of the disclosure. The memory circuit 100 includes an address decoder 110 and a memory array 120. The memory circuit 100 receives a binary address for selection of a memory location and a clock signal that synchronizes the decoding of the binary address. The binary address and clock signal can be received from various sources, which may depend on a type of memory system or configuration. The various sources can be, for example, a processor, such as a CPU, or a type of memory controller. The memory circuit 100 can also include other components of a memory system, such as a column decoder. The memory circuit 100 can be a low level cache that can be part of a load-to-use path when fetching data from memory. The memory circuit 100 can be, for example, an embedded RAM, a lower level cache, an L1 cache memory, or a SRAM.

The memory circuit 100 and the example circuits of FIGS. 2-5 and 7 can be part of a library of circuit designs that can be used in the design and construction of electronic circuits. The library of circuit designs can be stored on a computing device having one or more memories and one or more processors. The electronic circuits can be used in autonomous machines, such as autonomous vehicles, semi-autonomous vehicles, autonomous robots or robotic platforms, or semi-autonomous robots or robotic platforms. The electronic circuits can be used in various computing devices or platforms located in data centers and/or used for cloud computing.

The memory array 120 includes memory cells organized in rows that correspond to wordlines and columns that correspond to bitlines, wherein each of the wordlines are each uniquely identified by a binary memory address, or simply binary address. The address decoder 110 receives the binary address and decodes the address to assert the correct wordline. The binary address corresponds to the size of the memory array 120. For example, the memory array 120 can be an array of 256 rows of a bitcells and the binary address can be an 8-bit address delivered via an 8-bits address bus.

Figure 2:
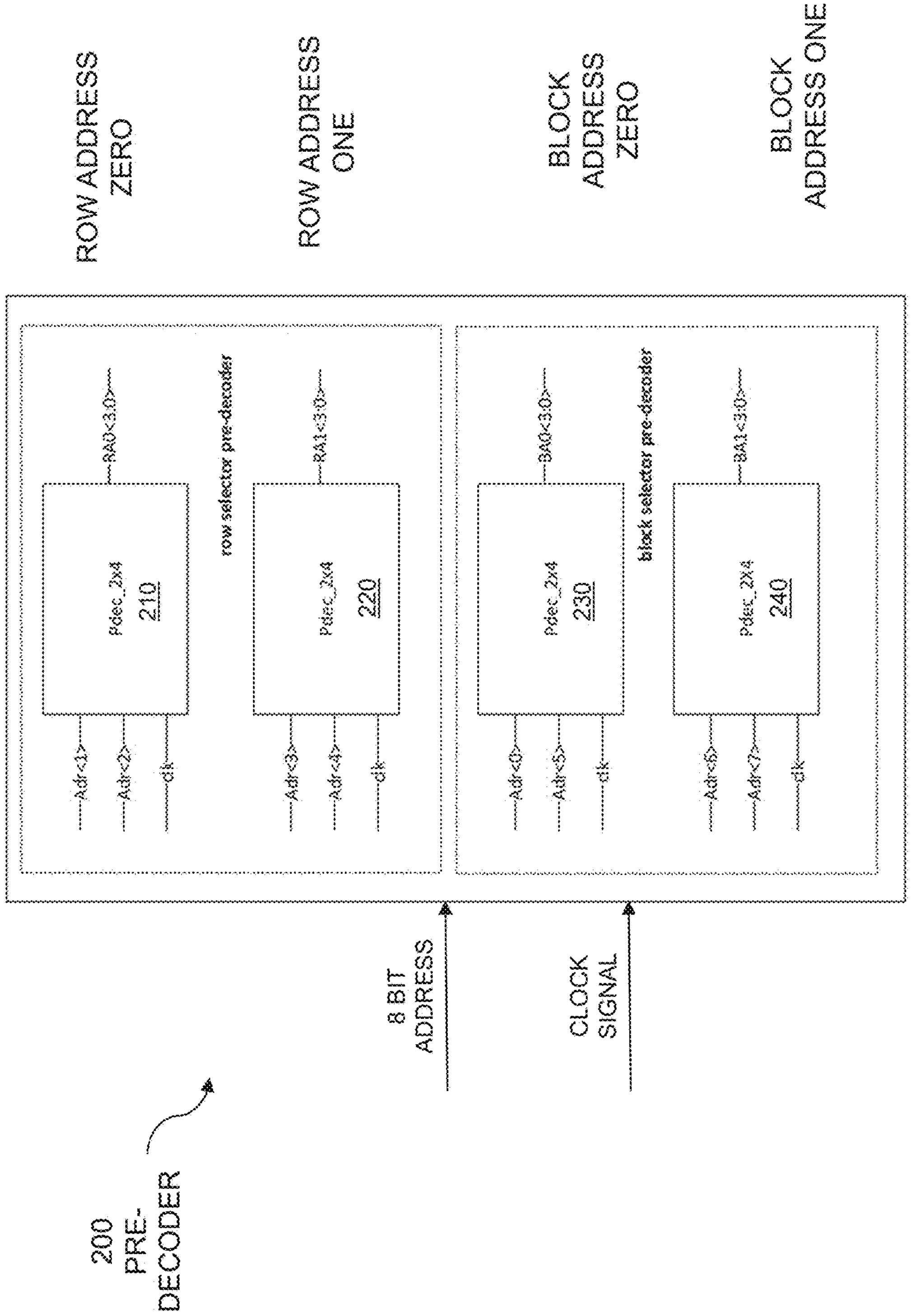
FIG. 2 illustrates a block diagram of an example of a pre-decoder constructed according to the principles of the disclosure.
Figure 3:
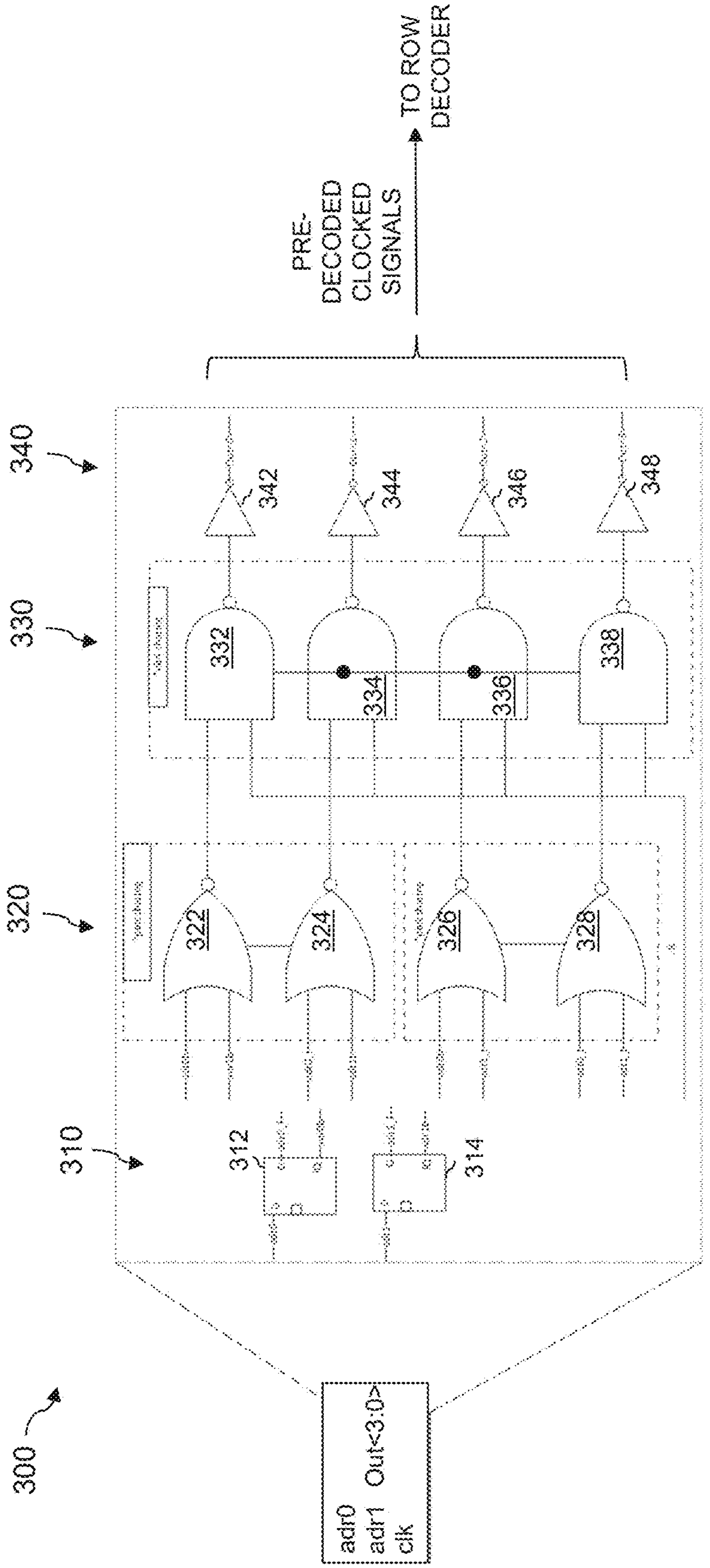
FIG. 3 illustrates a logic diagram of an example of a decoder constructed according to the principles of the disclosure.
Figure 5:
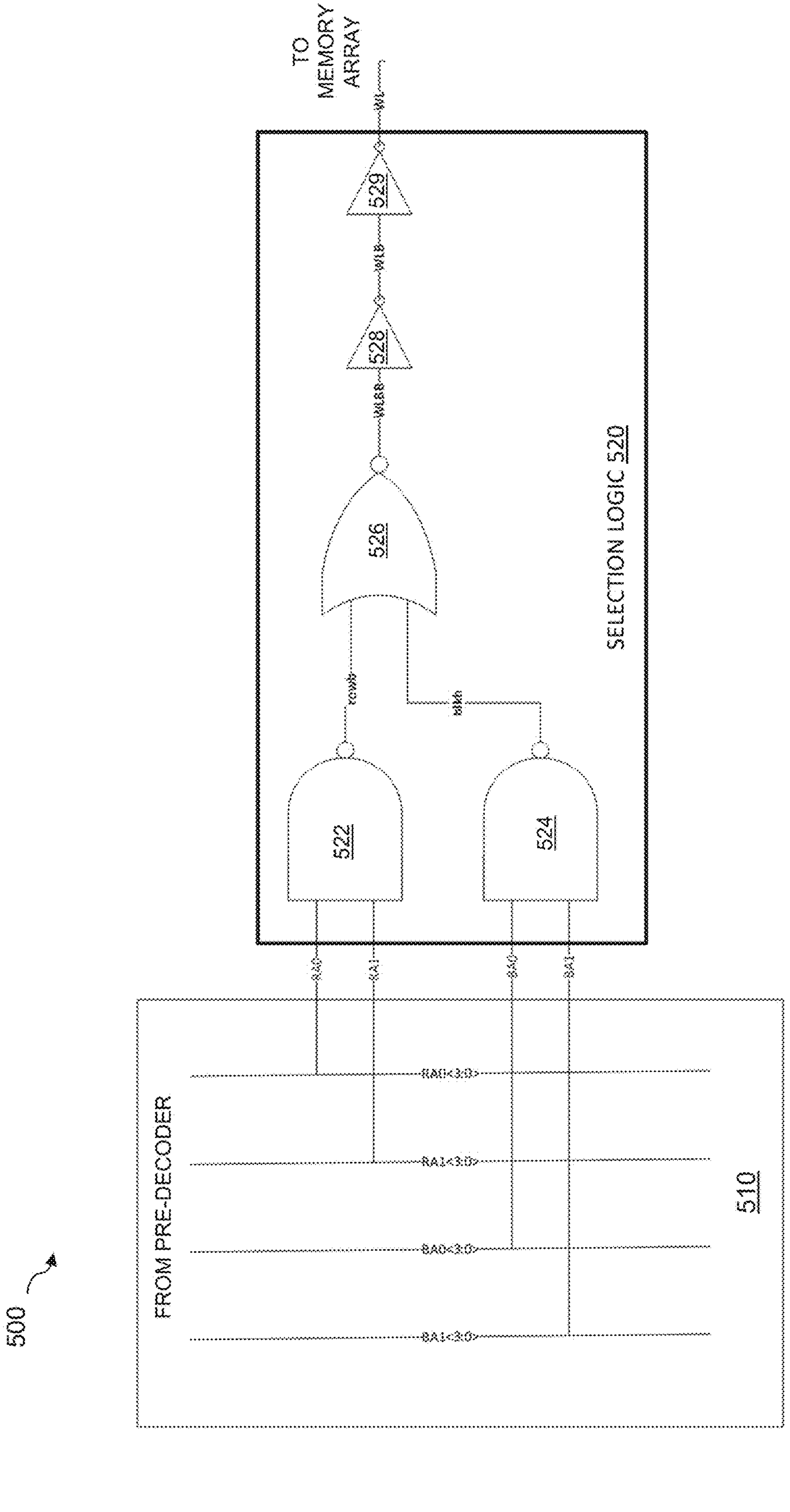
FIG. 5 illustrates a logic diagram of an example of a row decoder constructed according to the principles of the disclosure.

The address decoder 110 includes a pre-decoder 112 and a row decoder 114. The pre-decoder 112 has multiple decoders and is clocked via the clock signal. Each of decoders generate clocked pre-decode signals from a portion of the binary address received and provide the clocked pre-decode signals to the row decoder 114 for further decoding to assert one of the wordlines of the memory array 120. Since all pre-decoded signals are clocked, setup and hold of all addresses occur at the pre-decoder 112 rather than at row decoder 114, which is not clocked. For example, setup can be either at a latch or at logic gates of the pre-decoder 112 depending on the timing of the latch clock versus the logic gates' clock. FIG. 3 includes examples of latches 310 and NAND gates 340 where set-up can occur. Hence there is a shorter data path that leads to smaller setup time. Additionally, there is not an internal hold margin in the row decoder 114. FIG. 2 provides an example configuration of a pre-decoder for processing an 8 bit address and FIG. 5 illustrates an example configuration of a row decoder for generating a wordline to assert.

FIG. 2 illustrates a block diagram of an example of a pre-decoder 200 constructed according to the principles of the disclosure. Pre-decoder 200 illustrates the ordering of address bits from an 8 bit address that allows sharing of logic gates and provides an example configuration of pre-decoder 112 in FIG. 1. Pre-decoder 200 includes four 2×4 decoders that each generate four clocked pre-decode signals that are used by a row decoder, such as row decoder 114, for generating row and block addresses. For example, the sixteen clocked pre-decode signals can be decoded inside row decoder 114 to generate 256 wordlines for selecting data from memory array.

Each of the 2×4 decoders 210, 220, 230, 240, are dedicated for selecting a row or a block of the memory array. Decoders 210 and 220 are for row selecting wherein 210 is for row address (RA) zero (RA0) and 220 is for RA1. Decoders 230 and 240 are for block selecting wherein decoder 230 is for block address (BA) zero (BA0) and 240 is for BA1. Each of the decoders 210, 220, 230, 240, receive two bits of the 8 bit address and a clock signal.

The ordering of the address bits received by each of the decoders 210, 220, 230, 240, are advantageously arranged for efficiency. Decoder 210 receives address bits 1 and 2, decoder 220 receives address bits 3 and 4, decoder 230 receives address bits 0 and 5, and decoder 240 receives address bits 6 and 7, wherein address bit 0 is the least significant address bit of the 8 bit address. FIG. 3 illustrates a logic diagram of an example of a 2×4 decoder that can be used with pre-decoder 200, such as for the 2×4 decoders 210, 220, 230, and 240.

FIG. 3 illustrates a logic diagram of an example of a decoder 300 constructed according to the principles of the disclosure. Decoder 300 illustrates the efficient designation of binary address bits and the sharing of internal nodes between different logic gates. More specifically, sharing of $N_{int}$ nodes and $P_{int}$ nodes are shown in FIG. 3. Decoder 300 provides an example configuration for each of decoders 210, 220, 230, and 240 of FIG. 2 using adr0 and adr1 as example address bits. In other words, decoder 300 corresponds to decoder 210 when replacing adr0 and adr1 with adr1 and adr2, respectively, wherein the output would be RA0. Similarly, decoder 300 corresponds to decoder 220 when replacing adr0 and adr1 with adr3 and adr4, wherein the row address would be RA1. The configuration and corresponding discussion similarly relate to examples of the other decoders 230, and 240 with the difference being the input of different address bits and the corresponding outputs.

Decoder 300 includes input latches 312, 314, NOR gates 322, 324, 326, and 328, NAND gates 332, 334, 336, and 338, and output inverters 342, 344, 346, and 348. The different latches, gates, and inverters are collectively referred to as input latches 310, NOR gates 320, NAND gates 330, and output inverters 340, respectively. In FIG. 3, the logic gates are NOR and NAND gates since they are more efficient than OR and gates and the received address bits and the outputs are inverted using the input latches 310 and output inverters 340. The output inverters 340 also build strength to drive a large load and reduce fanout. One skilled in the art will understand that the same functionality may be obtained using other logic gates. For example, though typically slower, OR and gates can be used. Additionally, NAND gates may be used followed by NOR gates, which would give an active-low signal rather than active-high. An ordering of NAND gates, inverters, and NAND gates, or NOR gates, inverters, NOR gates is another example of logic gates that can be used. With the second stage of the decoder 300, the internal node could be shared across the gates in pairs.

The input latches 310 and output inverters 340, the NOR gates 320, and the NAND gates 330 can be conventional components used in electronic circuits.

The input latches 310 receive two bits from the binary address and convert the received address signals to inverted signals. Input latch 312 receives address bit 0 and input latch 314 receives address bit 1. A unique combination of the received and inverted address bit signals are provided as inputs to the different NOR gates 320 as illustrated in FIG. 3, which facilitates sharing of internal nodes between adjacent logic gates of the decoder 300. For example, NOR gates 322 and 324 share a common $p_{int}$ node and NOR gates 322 and 324 share a common $p_{int}$ node. As such, a pair of the adjacent NOR gates 320 share a common $p_{int}$ node.

Figure 4:
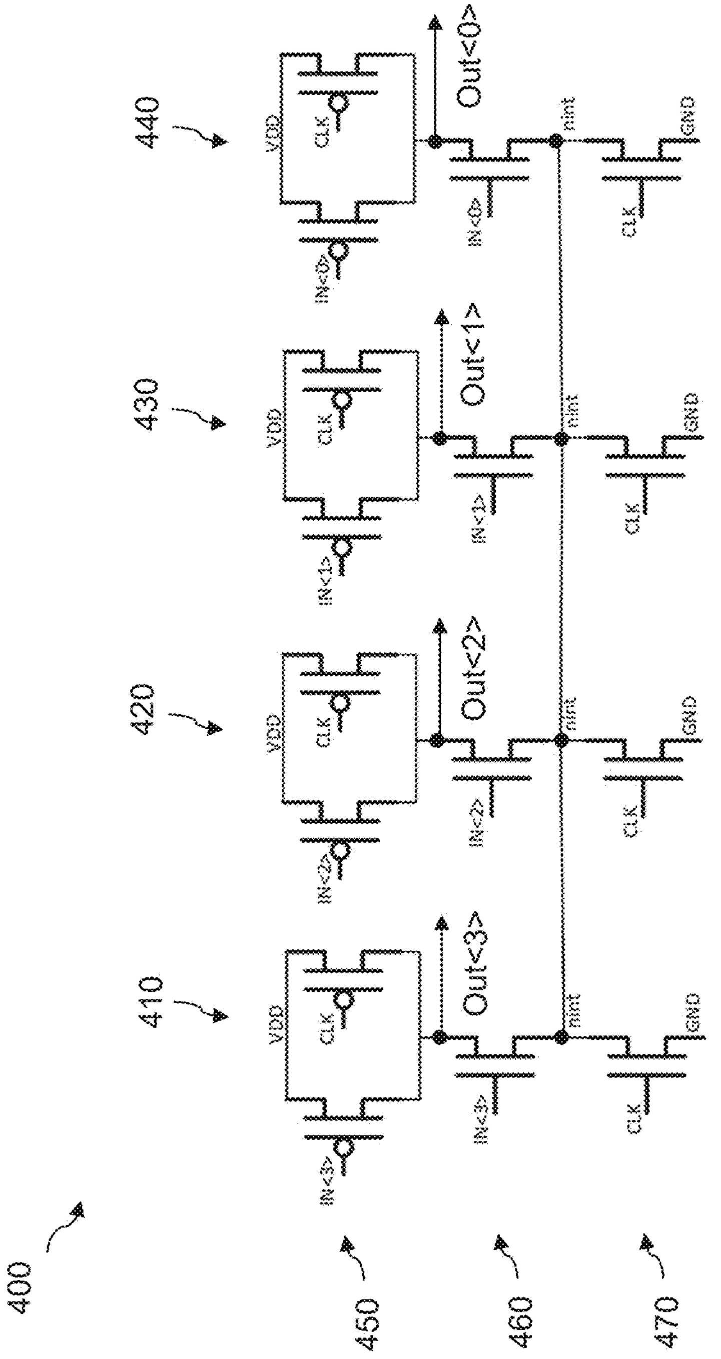
FIG. 4 illustrates a schematic diagram of an example of logic gates of a single 2×4 decoder used in a pre-decoder constructed according to the principles of the disclosure.

Each of the NAND gates 330 share a common $n_{int}$ node. Each of the NAND gates 330 also receive the clock signal. Since the inputs to the NAND gates 330 from the outputs of the NOR gates 320 will only have a single asserted signal, for example, only one can be asserted high, the intermediate net of all the NAND gates 330 can be shorted and the bottom most NMOS of the NAND gates 330 can be downsized since the effective size will be 4X. FIG. 4 illustrates an example of the NAND gates 330 that more clearly shows sharing of the $n_{int}$ node.

FIG. 4 illustrates a schematic diagram of an example of NAND gates 400 of a single 2×4 decoder used in a pre-decoder constructed according to the principles of the disclosure. The NAND gates 400 illustrate an example of the NAND gates 330 at a transistor level and demonstrate shorting of the internal $n_{int}$ node of the transistors connected to ground. Accordingly, NAND gates 410, 420, 430, and 440, provide examples of NAND gates 338, 336, 334, and 332, respectively. As such, the input signals IN<3,0> correspond to the outputs of the NOR gates 320. For example, IN<3> is the output of NOR gate 328, IN<2> is the output of NOR gate 326, IN<1> is the output of NOR gate 324, and IN<0> is the output of NOR gate 322.

Each of the NAND gates 410, 420, 430, 440, include transistors connected between rail voltage $V_{DD}$ and ground. A pair of PMOS transistors are connected in parallel with each source connected to $V_{DD}$. The PMOS transistors are generally denoted by element number 450. The drains of each of the PMOS transistors 450 are connected in series to an intermediate NMOS transistor that are generally denoted by element number 460. Each of the intermediate NMOS transistors 460 are also connected in series to a bottom or grounding NMOS transistor that is connected to ground. The grounding NMOS transistors receive the clock signal and are generally denoted by element number 470. One of the PMOS transistors 450 of each of the NAND gates 410, 420, 430, 440, also receive the clock signal.

As illustrated, the shorted $n_{int}$ node is between the intermediate NMOS transistors 460 and the grounding transistors 470 for each of the NAND gates 410, 420, 430, 440. The output of each of the NAND gates 410, 420, 430, 440, is located between the PMOS transistors 450 and the intermediate transistors 460. The respective outputs of each of the NAND gates 410, 420, 430, 440, are provide to a corresponding output inverter, such as one of the output inverters 340.

FIG. 5 illustrates a logic diagram of an example of a row decoder 500 constructed according to the principles of the disclosure. The row decoder 500 generates 256 wordlines wherein one of the wordlines is asserted according to inputs received from a pre-decoder, such as pre-decoder 200. Row decoder 500 provides an example configuration of row decoder 114 of FIG. 1.

Row decoder 500 receives sixteen inputs from a pre-coder over four different four-bit busses designated for RA0, RA1, BA0, and BA1. The row decoder 500 includes connection circuitry 510 that provides a connection from the pre-decoder to the selection logic 520. Selection logic 520 includes NAND gate 522, NAND gate 524, NOR gate 526, inverter 528, and inverter 529.

NAND gate 522 receives RA0 and RA1 and generates rowb. NAND gate 524 receives BA0 and BA1 and generates blkb. NOR gate 526 receives blkb and rowb and generates a selected wordline to assert after inverting by the inverters 528 and 529. The selected wordline is asserted and provided to a memory array, such as memory array 120, to obtain data. Table 1 illustrated in FIG. 6 provides an example of a logic table showing asserted wordlines based on the different binary address inputs applied to pre-decoders, such as pre-decoder 200, which feeds row decoder 500.

Table 1 includes columns for the binary address, pre-decoded output signals, block selector, row selector, and wordline. The pre-decoded output signals RA0, RA1, BA0, and BA1 correspond to the inputs of the selection logic 520 as a result of the binary address received by pre-decoder 200. The block selector, row selector, and wordline correspond respectively to the outputs of NAND gate 524, NAND gate 522, and inverter 529 in FIG. 5. As noted above, ordering of the binary address bits allows sharing of logical gates.

As noted above in FIG. 2 the ordering of the address bits is:

- ra0[3:0] = decode(adr2, adr1)
- ra1[3:0] = decode(adr4, adr3)
- ba0[3:0] = decode(adr5, adr0)
- ba1[3:0] = decode(adr7, adr6).

With such an ordering, the rows are decoded as:

- row[0] = ba1[0] *ba0[0] * ra1[0] * ra0[0]
- row[1] = ba1[0] *ba0[1] * ra1[0] * ra0[0]
- row[2] = ba1[0] *ba0[0] * ra1[0] * ra0[1]
- row[3] = ba1[0] *ba0[1] * ra1[0] * ra0[1]
- row[4] = ba1[0] *ba0[0] * ra1[0] * ra0[2]
- . . .
- row[14] = ba1[0] *ba0[0] * ra1[1] * ra0[3]
- row[15] = ba1[0] *ba0[1] * ra1[1] * ra0[3]
- row[16] = ba1[0] *ba0[0] * ra1[2] * ra0[0]
- row[17] = ba1[0] *ba0[1] * ra1[2] * ra0[0]
- . . .
- row[30] = ba1[0] *ba0[0] * ra1[3] * ra0[3]
- row[31] = ba1[0] *ba0[1] * ra1[3] * ra0[3]
- row[32] = ba1[0] *ba0[2] * ra1[0] * ra0[0]
- row[33] = ba1[0] *ba0[3] * ra1[0] * ra0[0]
- . . .

Ordering the binary address bits such that a 2×4 decoder receives address bits 0 and 5 eliminates the need of multiple tracks for each blkb without changing wordline scrambling compared to conventional processing of binary addresses. FIG. 7 illustrates an example of a layout illustrating an advantage of the bit-ordering.

FIG. 7 illustrates a layout of an example of an address decoder 700 constructed according to the principles of the disclosure. The layout shows where the gates can be physically located in an actual floor plan of an address decoder 700, such as the address decoder 110 of FIG. 1 and the example pre-decoders and row decoder of FIGS. 2, 3, 4, and 4. Advantageously the disclosed scheme allows a more efficient, floor plan. For example, the allowed scheme allows one rowb NAND gate to be shared between two wordlines, and the $n_{int}$ of rowb NAND gate can be shared across eight wordlines. Additionally, blkb NAND gate can be shared between 8 wordlines and $n_{int}$ of blkb NAND gate can be shared as widely as 64 wordlines; all which targets higher drive strength for first stage gates (rowb NAND and blkb NAND) in a row decoder without increasing their fan-in. All of the $n_{int}$ and $p_{int}$ sharing allows to place a higher effective fan-out NAND and NOR gates in row decoder without unnecessary loading pre-decode lines.

Other layouts can be obtained with different ordering of the address bits. For example, address bits 0 and 1 can be for block address zero (ba0), which would enable the NAND gate to be shared across 4 wordlines and $n_{int}$ of rowb across sixteen wordlines. Such ordering of the bits and the layout, however, would result in further routing for the blkb signals and they would become the critical path.

The disclosed decoding scheme is efficient in terms that it saves additional routes when building RAM to selectively enable or disable a "wing of butterfly" (half of the IOs). To achieve such "wing" control, a separate wordline driver for the wings of butterfly can be used where each wordlines can be enabled or disabled selectively. For such enabling/disabling, the wing enable (AE) is gated into the block enable (blkb).

In address decoder 700, the ra1 and ra0 being used are the same for each pair of rows. Accordingly, the rowb NAND gate can be shared. When minimizing the loading on ra* and ba* is prioritized over internal fanout, the load on ra1 and ra0 can be reduced by half (128 fins for ra1 and 96 fins for ra1) assuming a minimum of 2 fins per transistor.

In FIG. 7, ba0 is tapped for every other row and two decoders are arranged vertically, wherein the even blkb signals go to one row of decoders and the odd blkb signals to the other. The signals now route twice the horizontal distance, so there's no change in their total wire or transistor loading, or to the loading on ba0 and ba1 (to first order) compared to decoders using conventional address bit ordering.

A portion of the above-described apparatus, systems or methods may be embodied in or performed by various digital data processors or computers, wherein the computers are programmed or store executable programs of sequences of software instructions to perform one or more of the steps of the methods. The software instructions of such programs may represent algorithms and be encoded in machine-executable form on non-transitory digital data storage media, e.g., magnetic or optical disks, random-access memory (RAM), magnetic hard disks, flash memories, and/or read-only memory (ROM), to enable various types of digital data processors or computers to perform one, multiple or all of the steps of one or more of the above-described methods, or functions, systems or apparatuses described herein.

The digital data processors or computers can be comprised of one or more GPUs, one or more CPUs, one or more of other processor types, or a combination thereof. The digital data processors and computers can be located proximate each other, proximate an intelligent machine such as an AV, in a cloud environment, a data center, or located in a combination thereof. For example, some components can be located proximate the intelligent machine, such as a trained neural motion planner, and some components can be located in a cloud environment or data center, such as a neural motion planner that is being trained.

The GPUs can be embodied on a single semiconductor substrate, included in a system with one or more other devices such as additional GPUs, a memory, and a CPU. The GPUs may be included on a graphics card that includes one or more memory devices and is configured to interface with a motherboard of a computer. The GPUs may be integrated GPUs (iGPUs) that are co-located with a CPU on a single chip.

The processors or computers can be part of GPU racks located in a data center. The GPU racks can be high-density (HD) GPU racks that include high performance GPU compute nodes and storage nodes. The high performance GPU compute nodes can be servers designed for general-purpose computing on graphics processing units (GPGPU) to accelerate deep learning applications. For example, the GPU compute nodes can be servers of the DGX product line from NVIDIA Corporation of Santa Clara, California.

The compute density provided by the HD GPU racks is advantageous for AI computing and GPU data centers directed to AI computing. The HD GPU racks can be used with reactive machines, autonomous machines, self-aware machines, and self-learning machines that all require a massive compute intensive server infrastructure. For example, the GPU data centers employing HD GPU racks can provide the storage and networking needed to support large-scale neural network (NN) training, such as for the NNs disclosed herein used for neural motion planners. The NNs can be Deep Neural Networks (DNN).

The NNs disclosed herein include multiple layers of connected nodes that can be trained with input data to solve complex problems. For example, contextual data, UPC, proposed trajectories, or a combination thereof can be used as input data for training of the NN. Once the NNs are trained, the NNs can be deployed and used to generate planned trajectories.

In one example of training, data flows through the NNs in a forward propagation phase until a prediction is produced that indicates a label corresponding to the input. When the NNs do not correctly label the input, errors between the correct label and the predicted label are analyzed, and the weights are adjusted for features of the layers during a backward propagation phase that correctly labels the inputs in a training dataset. With thousands of processing cores that are optimized for matrix math operations, GPUs such as noted above are capable of delivering the performance required for training NNs for artificial intelligence and machine learning applications.

Portions of disclosed embodiments may relate to computer storage products with a non-transitory computer-readable medium that have program code thereon for performing various computer-implemented operations that embody a part of an apparatus, device or carry out the steps of a method set forth herein. Non-transitory used herein refers to all computer-readable media except for transitory, propagating signals. Examples of non-transitory computer-readable media include, but are not limited to: magnetic media such as hard disks, floppy disks, and magnetic tape; optical media such as CD-ROM disks; magneto-optical media such as floptical disks; and hardware devices that are specially configured to store and execute program code, such as ROM and RAM devices. Examples of program code include both machine code, such as produced by a compiler, and files containing higher level code that may be executed by the computer using an interpreter.

In interpreting the disclosure, all terms should be interpreted in the broadest possible manner consistent with the context. In particular, the terms "comprises" and "comprising" should be interpreted as referring to elements, components, or steps in a non-exclusive manner, indicating that the referenced elements, components, or steps may be present, or utilized, or combined with other elements, components, or steps that are not expressly referenced. Configured or configured to means, for example, designed, constructed, or programmed, with the necessary logic and/or features for performing a task or tasks.

Those skilled in the art to which this application relates will appreciate that other and further additions, deletions, substitutions, and modifications may be made to the described embodiments. It is also to be understood that the terminology used herein is for the purpose of describing particular embodiments only, and is not intended to be limiting, since the scope of the present disclosure will be limited only by the claims. Unless defined otherwise, all technical and scientific terms used herein have the same meaning as commonly understood by one of ordinary skill in the art to which this disclosure belongs. Although any methods and materials similar or equivalent to those described herein can also be used in the practice or testing of the present disclosure, a limited number of the exemplary methods and materials are described herein.

Each of the aspects disclosed in the Summary may have one or more of the additional features of the dependent claims in combination. It is noted that as used herein and in the appended claims, the singular forms "a", "an", and "the" include plural referents unless the context clearly dictates otherwise.

What is claimed is:

1. A memory circuit, comprising, an array of memory cells arranged in rows and columns; and an address decoder for decoding a binary address to assert wordlines associated with the rows, wherein the address decoder includes:

a row decoder for asserting one of the wordlines based on clocked pre-decode signals, and a pre-decoder having multiple decoders that generate the clocked pre-decode signals from the binary address and provide the clocked pre-decode signals to the row decoder for the asserting, wherein one or more of the multiple decoders include at least a first pair and a second pair of unclocked logic gates, wherein the first pair share a first internal node and the second pair share a second internal node.

2. The memory circuit as recited in claim 1, wherein each of the multiple decoders include at least two logic gates that share an internal node.

3. The memory circuit as recited in claim 1, wherein multiple of the multiple decoders include multiple pairs of unclocked logic gates and each one of the multiple pairs share an internal node.

4. The memory circuit as recited in claim 1, wherein each of the multiple decoders include at least four logic gates that share an internal node.

5. The memory circuit as recited in claim 1, wherein the binary address is an eight bit address, a number of the multiple decoders is four, and each one of the four decoders generates four of the clocked pre-decode signals by decoding two different address bits of the binary address.

6. The memory circuit as recited in claim 5, wherein a first decoder of the four decoders decodes address bits 2 and 1, a second decoder of the four decoders decodes address bits 4 and 3, a third decoder of the four decoders decodes address bits 5 and 0, and a fourth decoder of the four decoders decodes address bits 7 and 6, wherein bit 0 is the least significant bit.

7. The memory circuit as recited in claim 6, wherein the row decoder selects row ra0 using the clocked pre-decode signals of the first decoder, selects ra1 using the clocked pre-decode signals of the second decoder, selects block ba0 using the clocked pre-decode signals of the third decoder, and selects block ba1 using the clocked pre-decode signals of the fourth decoder.

8. The memory circuit as recited in claim 1, wherein the memory circuit is an embedded RAM.

9. The memory circuit as recited in claim 1, wherein the memory circuit is a L1 cache memory.

10. An integrated circuit (IC), comprising:

one or more processors to perform operations for processing data; and a memory circuit to store at least some of the data, including:

an array of memory cells arranged in columns and rows; and an address decoder for decoding a binary address to assert wordlines associated with the rows, wherein the address decoder comprises:

a row decoder for asserting one of the wordlines based on clocked pre-decode signals, and a pre-decoder having multiple decoders that generate the clocked pre-decode signals from the binary address and provide the clocked pre-decode signals to the row decoder for the asserting, wherein one or more of the multiple decoders include at least a first pair and a second pair of unclocked logic gates, wherein the first pair share a first internal node and the second pair share a second internal node.

11. The IC as recited in claim 10, wherein the memory circuit is a lower level cache.

12. The IC as recited in claim 10, wherein one or more of the multiple decoders include at least four logic gates that share an internal node.

13. The IC as recited in claim 10, wherein the binary address is an eight bit address, a number of the multiple decoders is four, and each one of the four decoders generates four of the clocked pre-decode signals by decoding two different address bits of the binary address.

14. The IC as recited in claim 13, wherein a first decoder of the four decoders decodes address bits 2 and 1, a second decoder of the four decoders decodes address bits 4 and 3, a third decoder of the four decoders decodes address bits 5 and 0, and a fourth decoder of the four decoders decodes address bits 7 and 6, wherein bit 0 is the least significant bit.

15. The IC as recited in claim 14, wherein the row decoder selects row ra0 using the clocked pre-decode signals of the first decoder, selects ra1 using the clocked pre-decode signals of the second decoder, selects block ba0 using the clocked pre-decode signals of the third decoder, and selects block ba1 using the clocked pre-decode signals of the fourth decoder.

16. The IC as recited in claim 1, wherein the memory circuit is an embedded RAM.

17. The IC as recited in claim 1, wherein the memory circuit is a L1 cache memory.

18. An address decoder for decoding a binary address to assert wordlines associated with rows of a memory array, comprising:

a row decoder for asserting one of the wordlines based on clocked pre-decode signals, and a pre-decoder having multiple decoders that generate the clocked pre-decode signals from the binary address and provide the clocked pre-decode signals to the row decoder for the asserting, wherein one or more of the multiple decoders include at least a first pair and a second pair of unclocked logic gates, wherein the first pair share a first internal node and the second pair share a second internal node.

19. The address decoder as recited in claim 18, wherein the binary address is an eight bit address, a number of the multiple decoders is four, and each one of the four decoders generates four of the clocked pre-decode signals by decoding two different address bits of the binary address.

20. The address decoder as recited in claim 18, wherein the memory circuit is a lower level cache.

* * * * *